United States Patent
Greenlee et al.

(10) Patent No.: US 11,131,032 B2
(45) Date of Patent: Sep. 28, 2021

(54) METAL ALLOY CORE-SHELL NANOPARTICLES AND RELATED METHODS

(71) Applicant: The Board of Trustees of the University of Arkansas, Little Rock, AR (US)

(72) Inventors: Lauren Greenlee, Fayetteville, AR (US); Prashant Acharya, Fayetteville, AR (US)

(73) Assignee: THE BOARD OF TRUSTEES OF THE UNIVERSITY OF ARKANSAS, Little Rock, AR (US)

( * ) Notice: Subject to any disclaimer, the term of this patent is extended or adjusted under 35 U.S.C. 154(b) by 0 days.

(21) Appl. No.: 15/988,527

(22) Filed: May 24, 2018

(65) Prior Publication Data

US 2018/0340263 A1 Nov. 29, 2018

Related U.S. Application Data

(60) Provisional application No. 62/511,614, filed on May 26, 2017.

(51) Int. Cl.
*B22F 1/00* (2006.01)
*B22F 9/24* (2006.01)
*C25B 11/091* (2021.01)
*C25B 1/04* (2021.01)
*B01J 23/755* (2006.01)
*B01J 35/00* (2006.01)
(Continued)

(52) U.S. Cl.
CPC ........... *C25B 11/091* (2021.01); *B01J 23/755* (2013.01); *B01J 35/002* (2013.01); *B01J 35/004* (2013.01); *B01J 35/0013* (2013.01);
*B01J 35/0033* (2013.01); *B01J 35/0073* (2013.01); *B01J 37/0072* (2013.01); *B01J 37/04* (2013.01); *B22F 1/0018* (2013.01); *B22F 1/0044* (2013.01); *B22F 9/24* (2013.01);
(Continued)

(58) Field of Classification Search
None
See application file for complete search history.

(56) References Cited

U.S. PATENT DOCUMENTS

| | | | | |
|---|---|---|---|---|
| 6,368,406 B1 * | 4/2002 | Deevi | ...................... | B22F 9/12 117/108 |
| 2007/0227300 A1 * | 10/2007 | McGrath | .................. | B01J 23/89 75/255 |

(Continued)

OTHER PUBLICATIONS

Ali et al., "Synthesis, characterization, applications, and challenges of iron oxide nanoparticles", Aug. 19, 2016, Nanotechnology, Science and Applications, vol. 9, pp. 49-67. (Year: 2016).*

(Continued)

*Primary Examiner* — Xiaobei Wang
(74) *Attorney, Agent, or Firm* — J. Clinton Wimbish; Nexsen Pruet, PLLC

(57) ABSTRACT

Metallic nanoparticles and related methods of making and using the same are described herein. An aqueous synthesis method is used to create nanoparticle cores comprising alloys of two or more metals at varying metal:metal molar ratios. In some embodiments, the nanoparticle cores described herein form a homogeneous metal alloy. Alternatively, the nanoparticle cores form a heterogeneous metal alloy. The synthesis method can further comprise forming mixed metal oxide shells on the nanoparticle cores.

5 Claims, 7 Drawing Sheets

Core Synthesis

(51) Int. Cl.
  B01J 37/04   (2006.01)
  B01J 37/00   (2006.01)
  C25B 11/04   (2021.01)
  C25B 11/061  (2021.01)
  H01L 35/22   (2006.01)
  H01L 35/26   (2006.01)
  H01L 35/20   (2006.01)

(52) U.S. Cl.
  CPC ............... *C25B 1/04* (2013.01); *C25B 11/04* (2013.01); *C25B 11/061* (2021.01); *B01J 35/0006* (2013.01); *B22F 2201/03* (2013.01); *B22F 2301/15* (2013.01); *B22F 2301/35* (2013.01); *H01L 35/20* (2013.01); *H01L 35/22* (2013.01); *H01L 35/26* (2013.01); *Y10T 428/12028* (2015.01); *Y10T 428/12181* (2015.01)

(56) References Cited

U.S. PATENT DOCUMENTS

2010/0314578 A1\* 12/2010 Purdy .................. B22F 9/24 252/186.1
2012/0235076 A1\* 9/2012 Iftime ................. H01F 1/0054 252/62.54
2014/0162868 A1\* 6/2014 Greenlee .............. B01J 23/755 502/172
2016/0172085 A1\* 6/2016 Arnold ................. C23C 18/50 438/3

OTHER PUBLICATIONS

Pathade et al., "Understanding the Oxidation Behavior of Fe/Ni/Cr and Fe/Cr/Ni Core/Alloy Nanoparticles", Aug. 26, 2016, J. of Physical Chemistry, vol. 120, p. 22035-22044. (Year: 2016).\*

Zhu et al., "Enhancement of oxygen evolution performance through synergetic action between NiFe metal core and NiFeOx shell", Aug. 31, 2016, Chemical Communications, vol. 52, pp. 11803-11806. (Year: 2016).\*

Bieniek et al., "The effect of oxidation on the surface-near lattice relaxation in FeNi nanoparticles", May 22, 2011, J. Nanoparticle Research, vol. 13, pp. 5935-5946. (Year: 2011).\*

Encyclopaedia Britannica, "Permalloy", Dec. 4, 2014. (Year: 2014).\*

\* cited by examiner

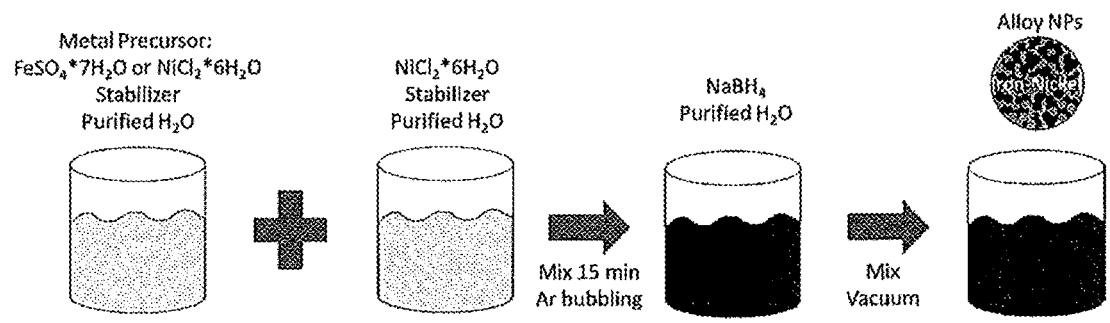
FIG. 1: Core Synthesis
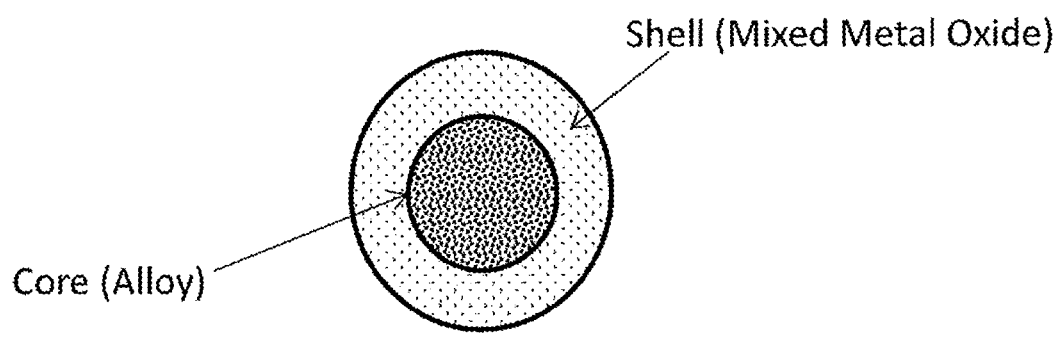
FIG. 2: Core-Shell Nanoparticle

| Sample | Atomic % | | | Weight % | | |
|---|---|---|---|---|---|---|
| | Fe | Ni | Ratio | Fe | Ni | Ratio |
| Fe:Ni (5:1) | 82.18 | 17.22 | 4.77:1 | 82.06 | 17.94 | 4.57:1 |
| Fe:Ni (1:1) | 51.30 | 48.70 | 1.05:1 | 50.46 | 49.54 | 1.02:1 |
| Fe:Ni (1:5) | 17.87 | 82.13 | 1:4.60 | 17.15 | 82.85 | 1:4.83 |

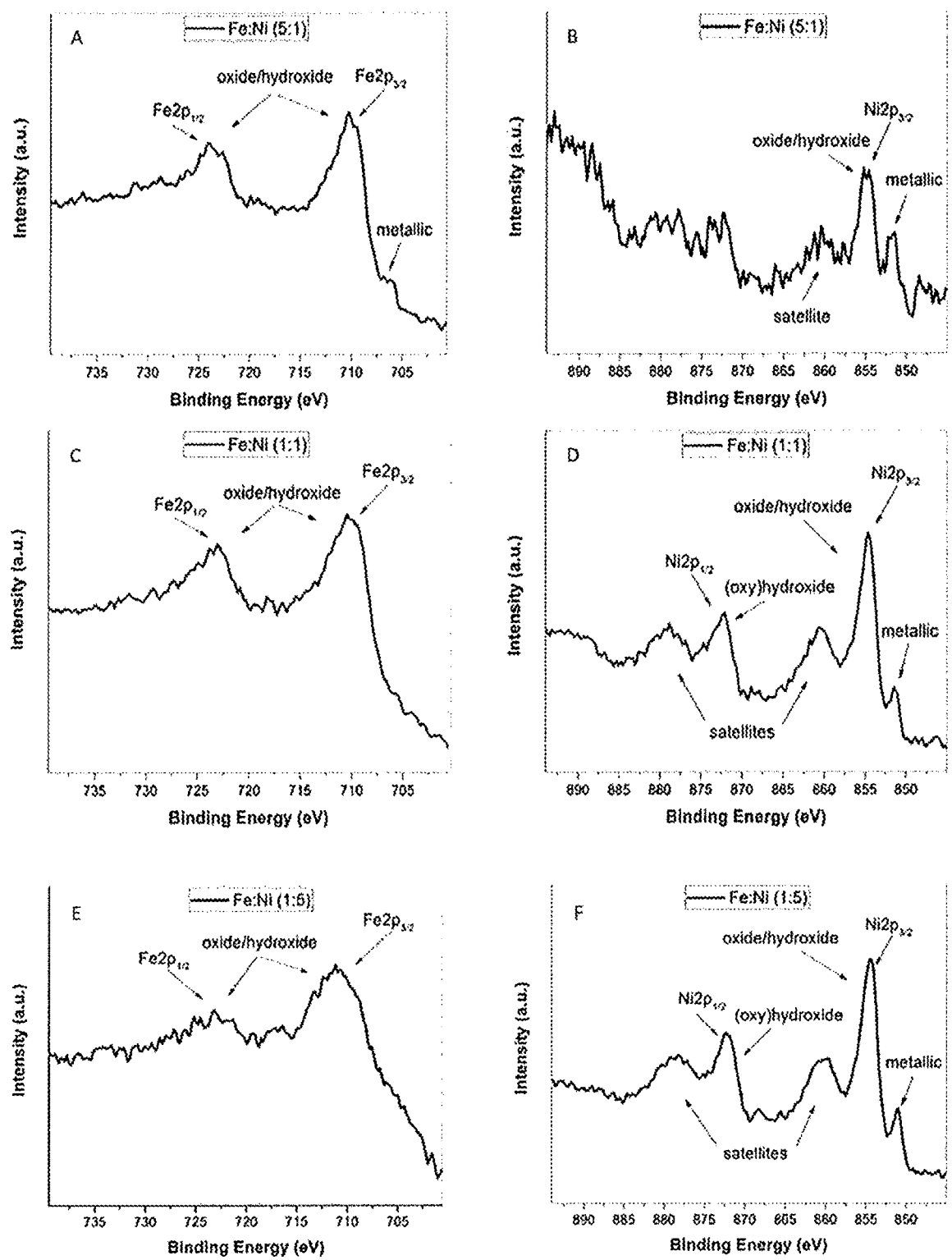
FIGs. 5A-5F- Surface Analysis showing mixed metal oxide content

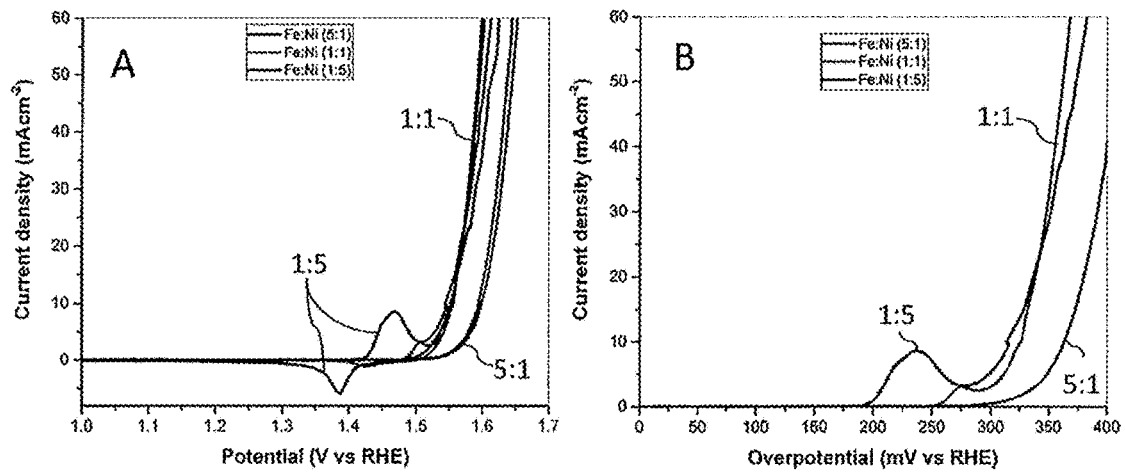
FIGs. 6A-6B- Cyclic voltammetry data
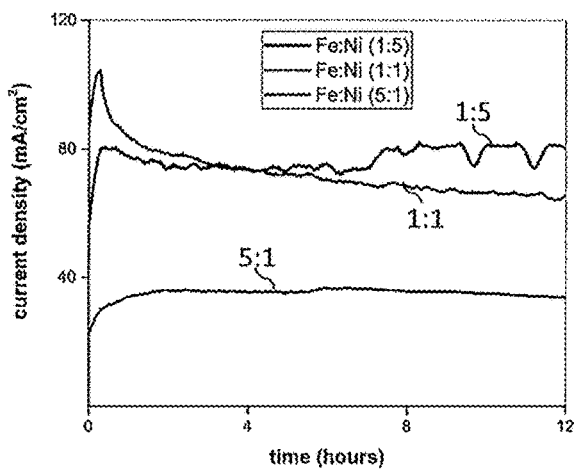
FIG. 7A
Chronoamperometry Results
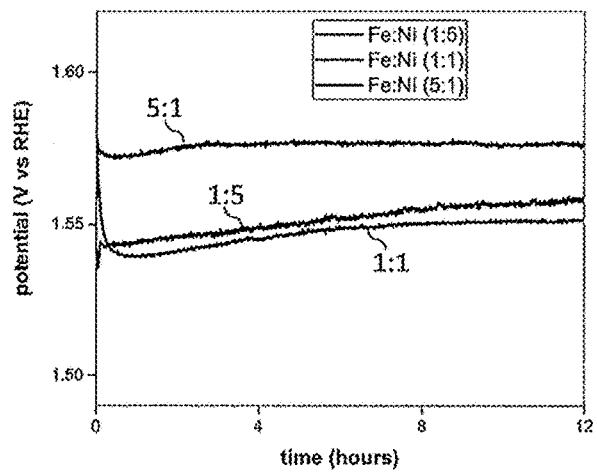
FIG. 7B
Chronopotentiometry Results

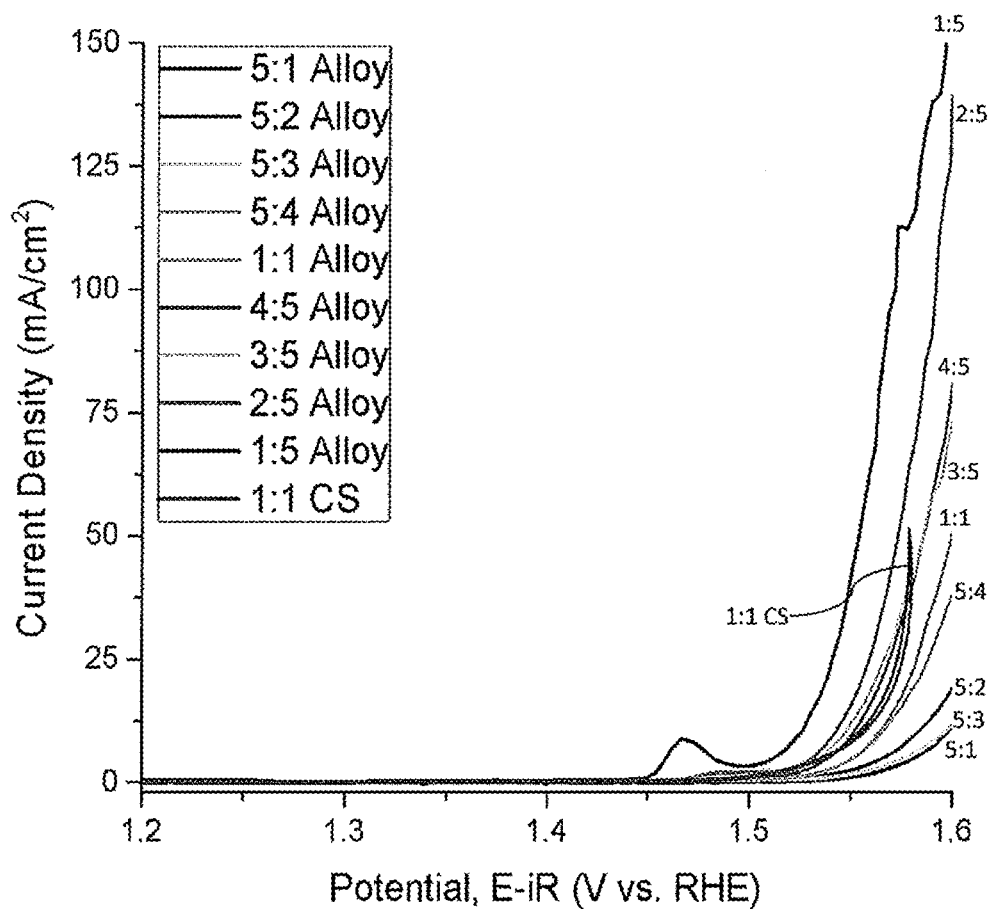
FIG. 8- Effect of molar ratio (Fe:Ni) on catalyst performance

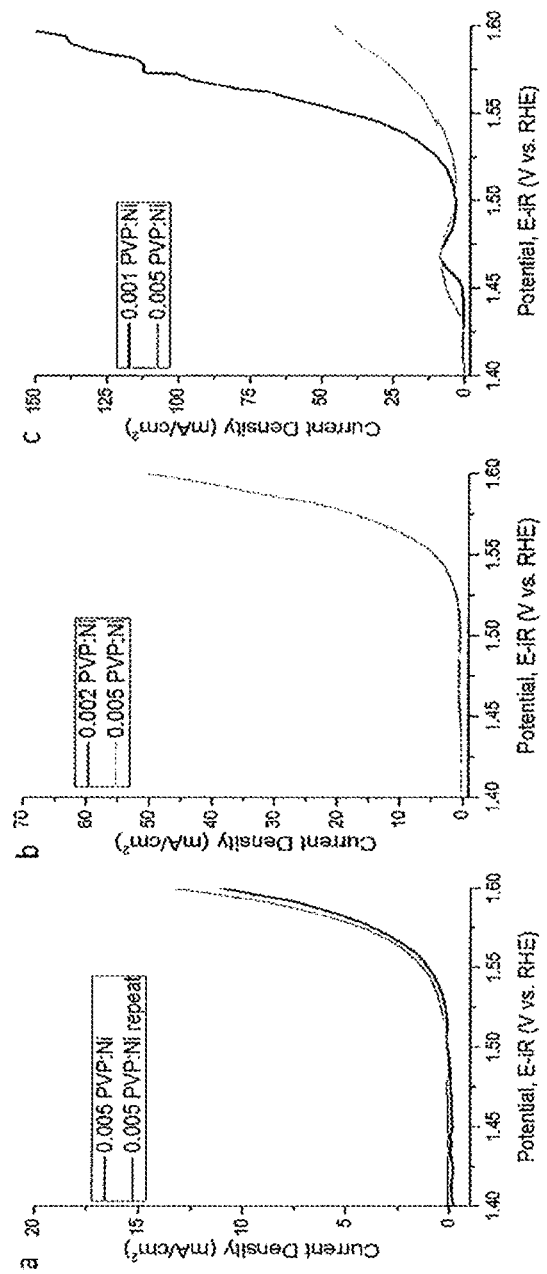
FIGs. 9A-9C – CV Catalyst Performance (A= 5:1; B= 1:1; C=1:5)

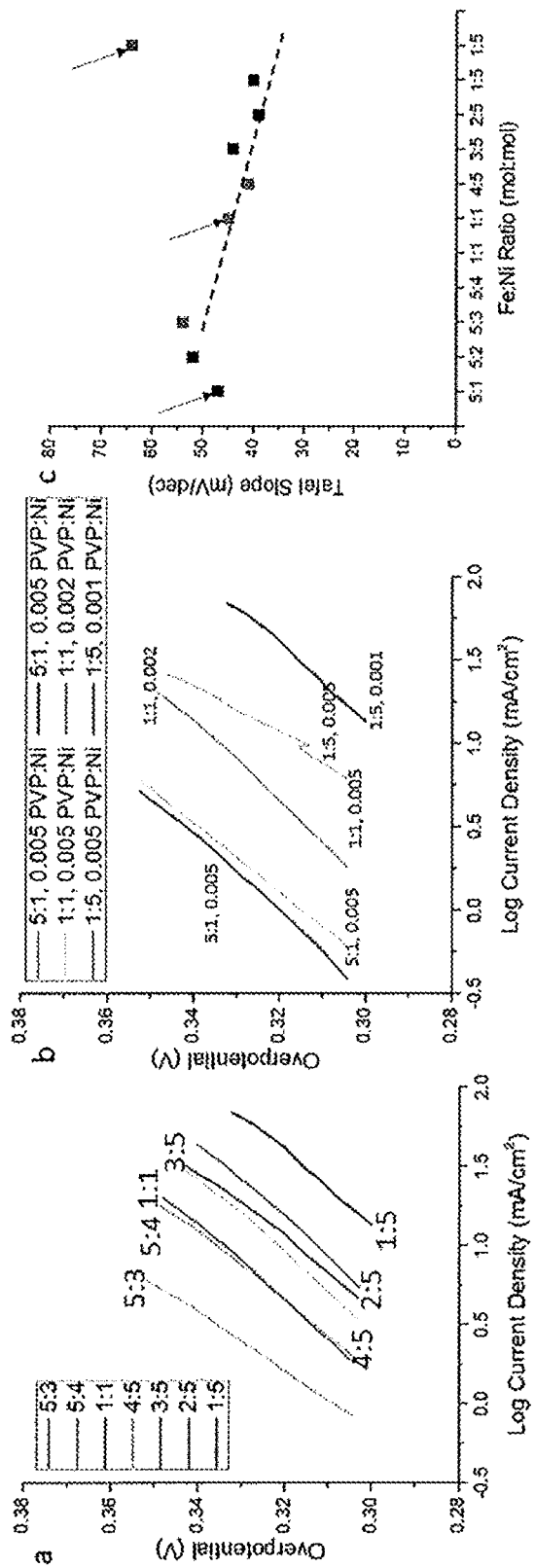
FIGs. 10A-C- Tafel Plots and Slope Values

METAL ALLOY CORE-SHELL NANOPARTICLES AND RELATED METHODS

RELATED APPLICATION DATA

The present application claims priority pursuant to 35 U.S.C. § 119(e) to U.S. Provisional Patent Application Ser. No. 62/511,614 filed May 26, 2017 which is incorporated herein by reference in its entirety.

BACKGROUND

Nanoparticles are being developed and used in many different types of applications, including, but not limited to use in industrial, electrical, chemical, pharmaceutical and manufacturing applications. One area of interest that is currently being pursued includes incorporation of nanoparticles in alternative and/or renewable energy sources. For example, platinum (Pt) based nanoparticles are being developed and used as catalysts and/or electrode components in alternative energy systems that operate via electrochemical reactions to generate, convert and/or store energy. However, Pt nanoparticles have many disadvantages, such as being costly, unstable, and difficult to synthesize, all while exhibiting mediocre reaction kinetics. These disadvantages can greatly inhibit the scalability and deployment of existing alternative energy systems employing nanoparticles.

Accordingly, a need exists for improved metal alloy core-shell nanoparticles and related methods. Such nanoparticles can be employed as catalysts in alternative energy systems, or in any other type application that may benefit from the nanoparticles described herein, including, but not limited to electrical, magnetic, electrochemical and thermoelectric applications.

BRIEF DESCRIPTION OF THE DRAWINGS

FIG. 1 is a schematic illustration of a method of making metal alloy core-shell nanoparticles according to some embodiments described herein.

FIG. 2 is a schematic illustration of a metal alloy core-shell nanoparticle according to some embodiments described herein.

FIGS. 5A-5F graphically depict surface analysis data associated with the metal alloy core-shell nanoparticles according to some embodiments described herein.

FIGS. 6A-6B graphically depict cyclic voltammetry data for the metal alloy core-shell nanoparticles according to some embodiments described herein.

FIGS. 7A-7B are graphical illustrations of respective chronoamperometry and chronopotentiometry results according to some embodiments described herein.

FIG. 8 is a graphical depiction of the molar ratio (Fe:Ni) of the metal alloy core-shell nanoparticles on catalyst performance according to some embodiments described herein.

FIGS. 9A-9C graphically depict cyclic voltammetry data according to some embodiments described herein.

FIGS. 10A-10C are Tafel plots and slope values as a function of Fe:Ni molar ratio according to some embodiments described herein.

DETAILED DESCRIPTION

Figures 3A, 3B, 3C, 3D, 3E, 3F, 4:
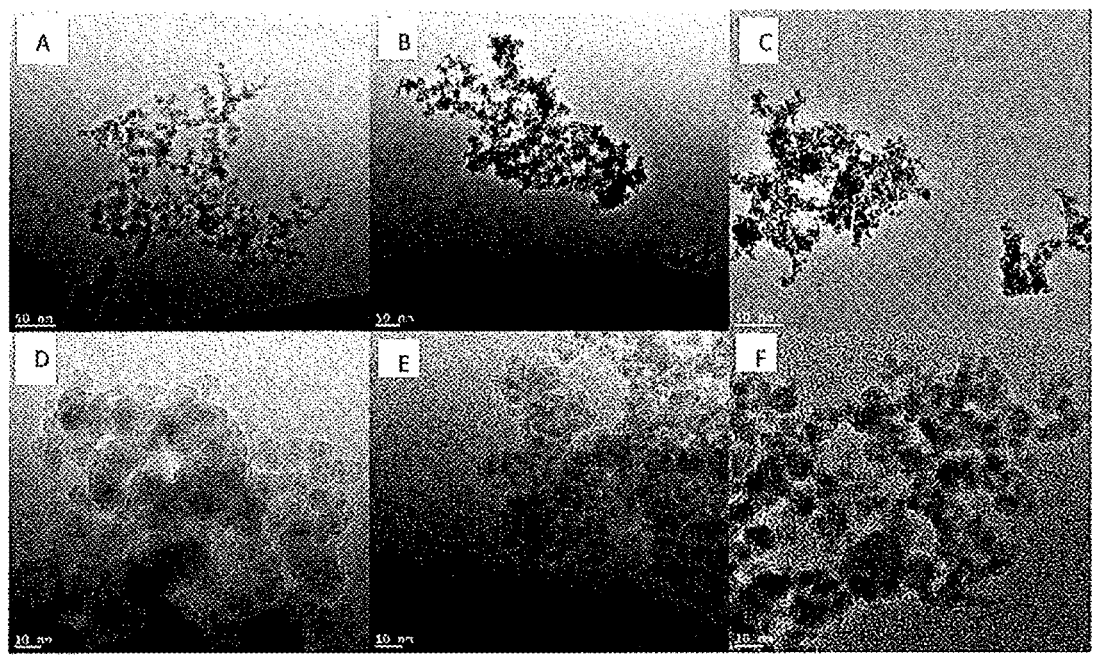
FIGS. 3A-3F are photographs of metal alloy core-shell nanoparticles according to some embodiments described herein.
FIG. 4 is a table depicting various molar and weight ratios associated with the metal alloy core-shell nanoparticles according to some embodiments described herein.

Metallic nanoparticles and related methods of making and using the same are described herein. An aqueous synthesis method is used to create nanoparticle cores comprising alloys of two or more metals at varying metal:metal molar ratios. In some embodiments, the nanoparticle cores described herein form a homogeneous metal alloy. Alternatively, the nanoparticle cores form a heterogeneous metal alloy.

In certain embodiments, the two or more metals forming the nanoparticle cores are iron (Fe) and nickel (Ni). The Fe—Ni alloys can have variable molar ratios of Fe:Ni. The synthesis method can further comprise forming a bimetallic Fe—Ni mixed metal oxide shell on the nanoparticle core. The shell can form a conformal or non-conformal coating on, over, and/or around the nanoparticle core. Such nanoparticles can be employed as catalysts in various types of electrochemical and/or photoelectrical chemical reactions, including high performance alkaline electrocatalysts for water splitting and potentially other reactions.

Notably, the nanoparticles described herein can be used as a catalyst, for example, an electrocatalyst or photocatalyst, for improving the kinetics in electrochemical, thermoelectrical, and/or electrolyzing devices and systems. Such devices and systems employ electrochemical, photoelectrical chemical and/or reduction-oxidation reactions for generating, converting, and/or storing energy. Exemplary devices and systems configured to employ the nanoparticles set forth herein include fuel cells, solar cells, water splitters, generators, water contaminant removal and degradation reactors, energy generating devices, energy storing devices, energy converting devices, electrolyzers, and/or any other type of thermoelectric or electrochemical devices and systems not inconsistent with the instant disclosure.

Further, the mixed metal core/mixed oxide shell nanoparticles described herein are "tunable" in terms of the resulting nanoparticle catalytic performance. For example, the catalytic performance or ability of the nanoparticles described herein is "tunable," in some aspects, via controlling the molar ratio of the metals and/or the amount of stabilizing ligand used during synthesis of the nanoparticles. As used herein, the terms "tunable" and "tuned" refer to the ability to control various aspects relating to the catalyst and/or its performance, such as the catalytic activity and/or stability as determined via the potential, overpotential, degradation rate, and/or current density.

The catalytic ability of the nanoparticles may be tuned via controlling the molar composition of Fe:Ni and/or the concentration of ligand used during synthesis. Various specific ligands can be used during synthesis of the nanoparticles to control the resultant nanoparticle size and/or morphology. Controlling the ratio of the Fe and Ni constituents allows control of the overall metal mixture in the nanoparticle core and shell. A borohydride reduction reaction is used to create the initial bimetallic nanoparticle cores. Controlled exposure to oxygen during the synthesis process allows the mixed oxide shell to form on, over, and/or around the nanoparticle cores. The nanoparticles set forth herein have demonstrated to be successful electrocatalysts for the water splitting reaction of $H_2O$ to oxygen. The metal:metal molar ratio and the ligand:metal ratio can be varied, as desired, for tuning the catalytic performance of the core-shell nanoparticles set forth herein.

In certain cases, the nanoparticles are synthesized from an aqueous mixture of a Fe salt stabilized by a phosphonic acid and a Ni salt stabilized by a ligand, such as a polymeric ligand. The mixture is degassed under argon and the metal salts are reduced using a sodium borohydride reducing agent. The mixed metal oxide shell is achieved via allowing a controlled amount of oxygen into the flask during synthesis. As noted above, the core and shell compositions can be controlled by controlling the starting molar ratio of the Fe precursor (e.g., the Fe salt) to the Ni precursor (e.g., Ni salt). By controlling the Fe:Ni molar ratio, desired alloy and shell compositions as well as catalytic performance can be achieved. The nanoparticle shape and/or morphology can be controlled by the ratio of stabilizing ligands.

The nanoparticles described herein can comprise any size and/or shape not inconsistent with the instant disclosure. Exemplary nanoparticle core lengths are set forth in the table below.

TABLE 1

Exemplary nanoparticle core size
in one, two, or three dimensions (nm)

1-500
1-400
1-300
1-200
1-100
1-50
1-25
1-10
0.05-10
0.01-10

In regards to the shape of the nanoparticle cores and/or resultant core-shell nanoparticles, the shape can be spherical, non-spherical, angular, regularly shaped, irregularly shaped, or combinations thereof. Different sizes and/or shapes of nanoparticles may be used in the devices and/or systems noted herein. The mixed metal oxide nanoparticle shells can comprise any thickness not inconsistent with the instant disclosure. Exemplary shell thicknesses are set forth in the table below.

TABLE 2

Exemplary shell thickness (nm)

0.01-50
0.01-25
0.01-10
0.01-5
0.1-50
0.1-10
0.1-5
0.1-2
0.1-1

Example 1

Nanoparticle Synthesis

In an exemplary embodiment, synthesis of bimetallic nanoparticles is performed using an aqueous synthesis technique. Notably, the nanoparticles may be used as catalysts, and are devoid of platinum. In this example, Fe—Ni nanoparticles were synthesized under room temperature and pressure conditions. All of the solutions used deionized water as the solvent.

Solutions of 29.79 g/L of phosphonic acid (i.e., aminotris (methylenephosphonic acid) (ATMP)) and 4.982 g/L of an Fe salt (i.e., ferrous sulfate heptahydrate ($FeSO_4.7H_2O$)) were mixed at a molar ratio of 0.05:1 with deionized $H_2O$ and hand-mixed for a short time. The ATMP compound stabilizes the Fe solution. Separately, a ligand stabilizer (i.e., polyvinyl pyrrolidone ($PVP_{40000}$)) and a Ni salt (i.e., Nickel (II) Chloride Hexahydrate ($NiCl_2.6H_2O$)) were hand-mixed together for a short time. The concentrations of $NiCl_2.6H_2O$ and $PVP_{40000}$ depend on the molar ratio of Fe and Ni desired. The molar ratio can be tuned for achieving a resultant composition and catalyst performance. The concentrations of the Ni precursor and the ligand stabilizer can also be varied and provided at different ratios for tuning the nanoparticle properties and/or the size or shape thereof.

The first mixture of the Fe/ATMP solution and the second mixture of Ni/PVP solution were transferred to a 250 mL three-neck borosilicate flask and placed on an orbital shaker. The solution inside the three-neck flask was mixed under argon gas for 15 minutes at 100 rpm. The iron-nickel solution was bubbled in order to prevent any unwanted oxidation of the iron and nickel precursors and to control oxidation during nanoparticle formation. Around 13 minutes into bubbling the solution with argon, $NaBH_4$ (molar ratio of metal:$BH_4^-$=(1:2.2)) was prepared so as to minimize the reaction of $NaBH_4$ with the water. The solution of sodium borohydride ($NaBH_4$) was then added into the metal precursor solution in the three-neck flask dropwise via a syringe at a rate of about 30 μl/s while handmixing the solution. Borohydride ions ($BH_4^-$) reduced the stabilized $Fe^{2+}$ and $Ni^{2+}$ ions into $Fe^0$ and $Ni^0$, respectively, forming nanoparticles during the reduction reaction.

The solution in the three-neck flask was then mixed under vacuum for 15 minutes on an orbital shaker at 100 rpm. After 15 minutes of mixing, the solution in the three-neck flask was transferred to a 50 mL test tube and centrifuged for approximately 3 minutes. Supernatant from the recently centrifuged test tube was decanted. The nanoparticles remaining in the test tube were mixed with 20 mL of methanol in a vortex shaker for about 30 seconds. The test tube containing the solution was again centrifuged for about 3 minutes and supernatant was decanted. The nanoparticles were then mixed with 20 mL of methanol and resuspended. Controlled exposure to oxygen during the synthesis process allowed the mixed oxide shell to form on the core nanoparticles.

The above described aqueous synthesis method was used to create Fe—Ni alloy nanoparticles with varying molar ratios of iron to nickel. Exemplary Fe:Ni ratios used to form the nanoparticles described herein are in the table below.

TABLE 3

Exemplary molar ratios (Fe:Ni)

5:1
5:2
5:3
5:4
1:1
4:5
3:5
2:5
1:5

Various concentrations of ligand:Ni can also be used during the aqueous synthesis process for controlling various aspects of the nanoparticles, such as the catalytic performance, size, shape, and/or morphology of the nanoparticles. Exemplary ligand:Ni ratios used to form the nanoparticles described herein are in the table below.

TABLE 4

Exemplary concentration ratios
(PVP:Ni) during synthesis 0.005:1
0.004:1
0.003:1
0.002:1
0.001:1

FIG. 1 is a schematic illustration of the aqueous synthesis process used to form the nanoparticle cores. FIG. 2 is a schematic illustration of a nanoparticle comprising a core and a shell. The core is an alloy formed from two or more metals and the shell is a mixed metal oxide formed from the two or more metals.

FIGS. 3A-3F are micrographs of various nanoparticles described herein, and FIG. 4 is a table illustrating compositions (i.e., atomic and weight) of various nanoparticles that demonstrated electrocatalytic and/or photocatalytic abilities.

Example 2

Electrochemical Analysis

Three populations of nanoparticles having the compositions set forth in FIG. 4 were synthesized with a constant PVP:Ni ratio of 0.005:1. FIGS. 5A-5B include surface data for Fe:Ni nanoparticles having a molar ratio of 5:1, FIGS. 5C-5D include for nanoparticles having a molar ratio of 1:1, and FIGS. 5E-5F include data for nanoparticles having a molar ratio of 1:5. As noted above, any molar ratio of Fe:Ni not inconsistent with the instant disclosure may be used during nanoparticle synthesis for tuning the catalytic capabilities. As FIGS. 5A-5F illustrate, the shells comprise and are formed from mixed metal oxides.

An electrochemical analysis technique of cyclic voltammetry (CV) was performed on the nanoparticles formed herein to obtain the data represented in FIGS. 6A-6B. As FIGS. 6A and 6B illustrate, the Fe:Ni nanoparticles having a molar ratio of 1:5 had the lowest onset potential followed by nanoparticles having molar ratios of 1:1 and 5:1. The same trend held true for the potential required to achieve a benchmark current density (j) of 10 mA/cm$^2$. The overpotentials for Fe:Ni (1:5), Fe:Ni (1:1), and Fe:Ni (5:1) were 313 mV, 327 mV, and 364 mV respectively at 10 mA/cm$^2$ (FIG. 6B).

Another benchmark used to test the catalysts in OER is to measure the current density at an overpotential ($\eta$) of 300 mV. Fe:Ni (1:5) yet again outperformed Fe:Ni (1:1) and Fe:Ni (5:1). The current density of the nanoparticles having the highest nickel content, Fe:Ni (1:5), had a current density of 4.92 mA/cm$^2$ which was followed by Fe:Ni (1:1) with 3.43 mA/cm$^2$ and Fe:Ni (5:1) with 0.54 mA/cm$^2$. Based on those two standards (j=10 mA/cm$^2$ and $\eta$=300 mV), it can be inferred that the Fe—Ni nanoparticle with iron proportion of 17% is the most active and the nanoparticle having iron quantity of 50% is only slightly less active. However, and unexpectedly, Fe:Ni (5:1) with high amount of iron performed significantly worse than the other two nanoparticles. Fe:Ni (1:5) had a large nickel redox peak while Fe:Ni (1:1) had notably smaller one and Fe:Ni (5:1) had virtually nonexistent nickel redox peak. It can be concluded from the FIG. 6A-6B that the molar ratios of Fe and Ni in the bimetallic nanoparticles have a considerable impact on the catalytic performance.

Chronoamperometry (CA) and chronopotentiometry (CP) data are shown in FIGS. 7A and 7B, respectively. CA was conducted at a constant potential of 1.6 V vs RHE and CP was performed at a constant current density of 10 mA/cm$^2$. Observing the CA data, Fe:Ni (5:1) is the most stable catalyst throughout the 12 hour period with a degradation rate of −0.0029 mA/hr. Interestingly, Fe:Ni (1:5) had a minor downward trend until 7$^{th}$ hour after which the current being produced slightly increased. The overall degradation rate for Fe:Ni (1:5) ended up being 0.0164 mA/hr. Fe:Ni (1:1) was the most unstable catalyst out of the three tested with a degradation rate of −0.0252 mA/hr. CP data in the bottom figure also indicates the stability of the nanoparticle catalysts. Fe:Ni (5:1) was the most stable with a degradation rate of 0.0172 mV/hr followed by Fe:Ni (1:1) with 0.9513 mV/hr and Fe:Ni (1:5) with 1.2881 mV/hr.

The data in FIGS. 6A-7B provide an insightful outlook on the three nanoparticles tested based on different molar ratio of metals. Even though, Fe:Ni (1:5) with the least amount of iron is the most active one for OER, it is not as stable as Fe:Ni (5:1) which had the highest iron content and also the most stable among the three nanoparticles. Fe:Ni (1:1) was both average in activity and stability.

FIG. 8 depicts CV data of nine (9) alloy nanoparticles with varying iron to nickel content and one Fe—Ni core-shell nanoparticle. Fe:Ni (1:5) is the most active among the catalysts. The activity trend mirrors the iron content in the nanoparticles as in the overpotential required to reach the benchmark current density of 10 mA/cm$^2$ decreases for catalyst with decreasing ratio of iron in the nanoparticles. Fe:Ni (5:1) required the highest overpotential (368 mV) while Fe:Ni (1:5) required the least overpotential (295 mV) to achieve a current density of 10 mA/cm$^2$. In the data presented in the top figure, alloy nanoparticles were synthesized with a range of PVP:Ni ratios (0.001-0.005). Of note, the optimally performing nanoparticle catalyst according to this example had both the lowest tested ratio of Fe:Ni (1:5) and the lowest tested ratio of PVP:Ni (0.001). Except for the Fe:Ni ratios of 5:1 and 5:2, all ratios tested were synthesized with lower PVP:Ni ratios of 0.001-0.002. The nanoparticles with a 5:1 Fe:Ni ratio had a PVP:Ni ratio of 0.005, and the nanoparticles with a 5:2 Fe:Ni ratio had a PVP:Ni ratio of 0.003. From the data obtained it is observed that, along with the molar ratio of metals, the ratio of PVP to the metal may also have an effect in the performance of the nanoparticles.

FIGS. 9A-9C illustrate performance based on varied PVP (i.e., ligand) concentrations used during synthesis. The concentration ratio of PVP plays a role in the electrocatalytic performance of these alloy nanoparticles, but the impact of PVP concentration may vary depending on the PVP concentration and the alloy nanoparticle bimetallic composition. Results for a molar ratio of 5:1 Fe:Ni and two alloy nanoparticle catalyst samples, each synthesized with a PVP:Ni ratio of 0.005 resulted in similar electrocatalytic performance (FIG. 9A). In comparison, alloy nanoparticles tested at a ratio of 1:1 Fe:Ni for two different PVP:Ni ratios (0.002 and 0.005) suggest that the higher PVP:Ni ratio did not negatively impact OER performance (FIG. 9B), and may have resulted in a slight improvement in performance. In contrast, the 1:5 Fe:Ni alloy nanoparticles tested in FIG. 9C resulted in a significant difference in catalytic performance for the two ratios of PVP:Ni tested (0.001 and 0.005). In this set of results, the decrease in the PVP:Ni ratio resulted in an increase in the overall current density measured, as well as an improvement in the overpotential (295 mV vs. 313 mV @ 10 mA/cm2 for PVP:Ni=0.001 vs. PVP:Ni 0.005). Also of note in regards to these results is the significant difference in catalytic performance observed as a function of Fe:Ni ratio.

Tafel plots of the alloy nanoparticles are shown in FIGS. 10A-10B. The data are summarized as a function of Fe:Ni molar ratio for similar, low PVP:Ni ratios of 0.001-0.002 in FIG. 10A, and the effect of PVP:Ni ratio on the Tafel curve and slope is shown in FIG. 10B for three sets of alloy nanoparticles (Fe:Ni ratios of 5:1, 1:1 and 1:5). A summary of the calculated Tafel slopes is shown in FIG. 10C as a function of Fe:Ni ratio, where higher PVP:Ni ratios are denoted by black arrows.

The summary of Tafel slopes in FIG. 10C suggests several potential trends. First, there is a general reduction in the Tafel slope as the Fe:Ni ratio decreases from 5:3 to 1:5 for samples that had low PVP:Ni ratios of 0.001-0.002. In FIG. 10C, the Tafel slope similarly decreases from 54 mV/dec to 40 mV/dec with a decrease in the atomic iron concentration from 63% to 17% (i.e., for a molar Fe:Ni ratio decrease from 5:3 to 1:5).

A second trend observed in the data presented in FIG. 10C is an increase in the Tafel slope for Fe:Ni ratios of 5:1 to 5:3. Further, the Tafel slope is affected by the increase in PVP:Ni ratio, where the higher ratio of 0.005 caused an increase in the Tafel slope for both molar ratios of Fe:Ni tested (1:1 and 1:5). In particular, the Tafel slope of the 1:5 Fe:Ni alloy nanoparticle catalyst increased significantly from 40 mV/dec to 64 mV/dec, with an increase in the PVP:Ni molar ratio from 0.001 to 0.005. Overall, the range of Tafel slopes calculated from the data shown falls within an expected range, except for the result from the 1:5 Fe:Ni nanoparticles synthesized with a PVP:Ni molar ratio of 0.005. It is possible that these results may also be affected by the available active surface area, and the trends observed in FIG. 10C may be suggesting changes to the active surface area with changes in bimetallic ratio and the presence of PVP.

The invention claimed is:

1. A method of making nanoparticles, the method comprising:
providing a core, the core being an alloy formed from two or more metals; and forming a shell on the core, the shell comprising a mixed metal oxide comprising the two or more metals and having a thickness of 0.1-2 nm, wherein forming the shell comprises exposing the core to oxygen during synthesis, and wherein providing the core comprises:
creating an aqueous mixture of the two or more metals.

2. The method of claim 1, wherein the two or more metals comprise iron (Fe) and nickel (Ni).

3. The method of claim 1, wherein the alloy is devoid of platinum (Pt).

4. The method of claim 1, wherein the core is a homogeneous alloy.

5. The method of claim 2, wherein the aqueous mixture further comprises ligand stabilizer for tuning size and/or shape of the nanoparticles.

* * * * *